(12) United States Patent
Co et al.

(10) Patent No.: US 7,478,290 B2
(45) Date of Patent: Jan. 13, 2009

(54) TESTING DRAM CHIPS WITH A PC MOTHERBOARD ATTACHED TO A CHIP HANDLER BY A SOLDER-SIDE ADAPTOR BOARD WITH AN ADVANCED-MEMORY BUFFER (AMB)

(75) Inventors: Ramon S. Co, Trabuco Canyon, CA (US); Tat Leung Lai, Torrance, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 361 days.

(21) Appl. No.: 11/309,296

(22) Filed: Jul. 24, 2006

(65) Prior Publication Data

US 2008/0126863 A1 May 29, 2008

(51) Int. Cl.
*G11C 29/00* (2006.01)
(52) U.S. Cl. ...................................................... 714/718
(58) Field of Classification Search ........................ None
See application file for complete search history.

(56) References Cited

U.S. PATENT DOCUMENTS

| | | | |
|---|---|---|---|
| 4,996,478 A | 2/1991 | Pope | 324/754 |
| 5,795,172 A | 8/1998 | Shahriari et al. | 439/260 |
| 6,040,691 A | 3/2000 | Hanners et al. | 324/158.1 |
| 6,178,526 B1 * | 1/2001 | Nguyen et al. | 714/42 |
| 6,348,810 B1 | 2/2002 | Yanagawa et al. | 324/765 |
| 6,357,022 B1 * | 3/2002 | Nguyen et al. | 714/42 |
| 6,357,023 B1 | 3/2002 | Co et al. | 714/42 |
| 6,415,397 B1 * | 7/2002 | Co et al. | 714/42 |
| 6,742,144 B2 | 5/2004 | Co | 714/42 |
| 6,762,615 B2 | 7/2004 | Lee et al. | 324/765 |
| 6,772,261 B1 | 8/2004 | D'Antonio et al. | 710/301 |
| 6,910,162 B2 | 6/2005 | Co et al. | 714/718 |
| 2003/0101391 A1 | 5/2003 | Man et al. | 714/718 |
| 2004/0004490 A1 | 1/2004 | Huang | 324/755 |
| 2004/0024557 A1 | 2/2004 | Chi et al. | 702/121 |
| 2005/0260868 A1 | 11/2005 | Lee | 439/66 |

* cited by examiner

*Primary Examiner*—Phung M Chung
(74) *Attorney, Agent, or Firm*—Stuart T. Auvinen; g Patent LLC

(57) ABSTRACT

Memory chips are tested by insertion into a chip test socket on a test adapter board that is mounted to the reverse or solder-side of a personal computer motherboard. A memory module socket is removed from the motherboard, and adapter pins are inserted into holes for the removed memory module socket, but from the reverse (solder) side of the motherboard. The adapter pins connect to the test adapter board either directly, through a connector plug, or through an intervening adapter board. The test adapter board has soldered onto it additional memory chips and buffer chips on a memory module, such as an Advanced Memory Buffer (AMB) for a fully-buffered memory module. The built-in-self-test (BIST) feature of the AMB may be used to test the memory chip under test in the chip test socket, or the processor on the motherboard may write and read the memory chip.

20 Claims, 11 Drawing Sheets

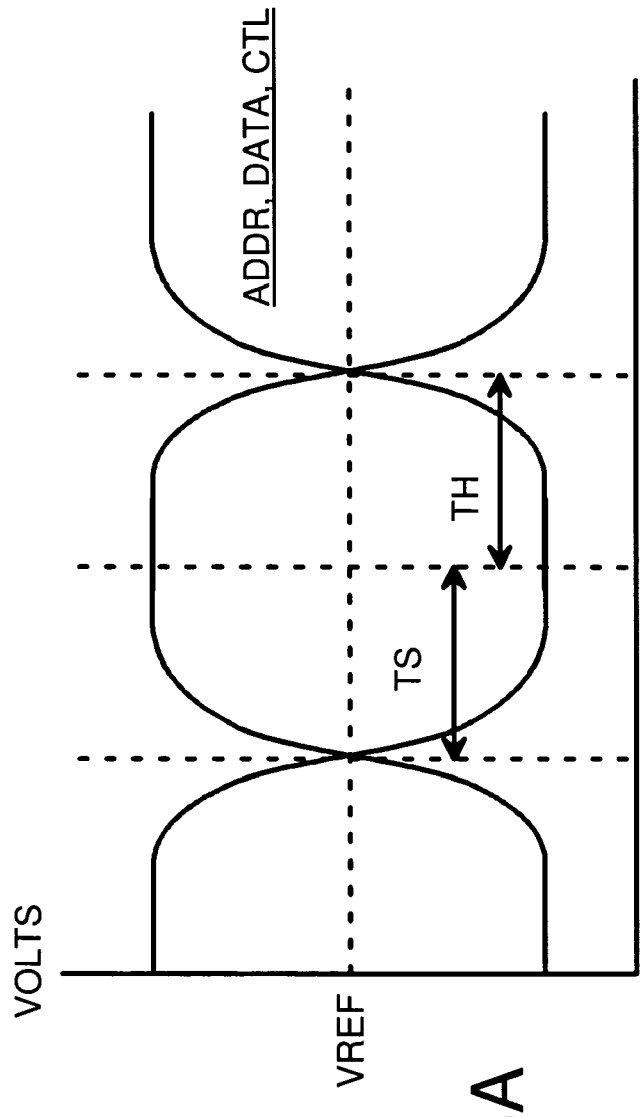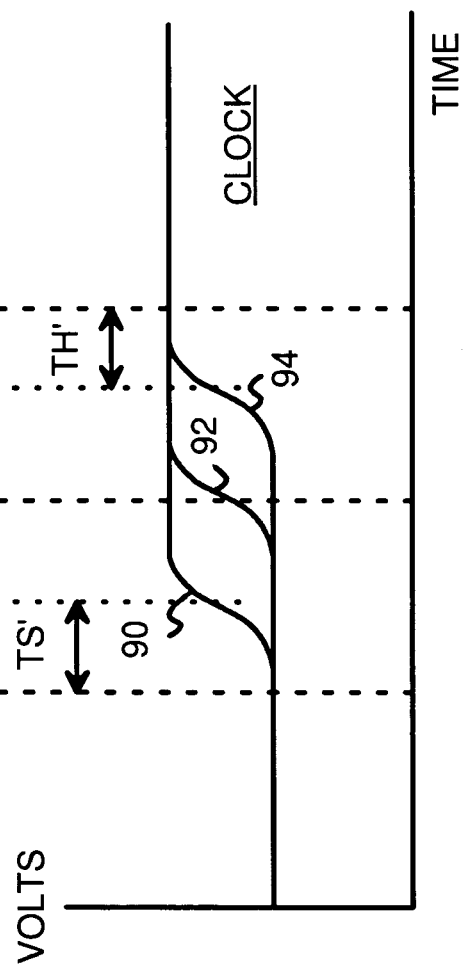
FIG. 8A
FIG. 8B

TESTING DRAM CHIPS WITH A PC MOTHERBOARD ATTACHED TO A CHIP HANDLER BY A SOLDER-SIDE ADAPTOR BOARD WITH AN ADVANCED-MEMORY BUFFER (AMB)

FIELD OF THE INVENTION

This invention relates to electronic test systems, and more particularly to test-adapter boards for testing memory chips using a personal computer motherboard.

BACKGROUND OF THE INVENTION

Electronic systems such as Personal Computers (PCs) use dynamic-random-access memory (DRAM) memory chips mounted on small, removable memory modules. The original single-inline memory modules (SIMMs) have been replaced with dual-inline memory modules (DIMMs), and 184-pin RIMMs (Rambus inline memory modules) and 184-pin DDR (double data rate) DIMMs.

The memory-module industry is very cost sensitive. Testing costs are significant, especially for higher-density modules. Specialized, high-speed electronic test equipment is expensive, and the greater number of memory cells on high-speed memory modules increases the time spent on the tester, increasing costs.

Handlers for integrated circuits (ICs) have been used for many years in the semiconductor industry. Handlers accept a stack of IC chips that are fed, one at a time, to the tester. The tested IC is then sorted into a "bin" for IC chips that have passed or failed the test. More recently, handlers have been made for memory modules.

FIG. 1 shows a memory module handler connected to a high-speed electronic tester. Memory modules 18 to be tested are loaded into the top of handler 10 in the input stack. Memory modules 18 drop down, one-by-one, into testing area. Module-under test MUT 20 is next to be tested. Arm 26 pushes MUT 20 laterally until it makes contact with contactor pins 16 that clamp down on "leadless" connector pads formed on the substrate of MUT 20.

Contactor pins 16 are also connected to test head 14, which makes connection to tester 12. Tester 12 executes parametric and functional test programs that determine when MUT 20 falls within specified A.C. and D.C. parameters, and whether all memory bit locations can have both a zero and a one written and read back.

Rather than test memory modules, handler 10 can feed packaged integrated circuit chips to tester 12. For example, DRAM chips are typically tested using a handler and a tester before being assembled into memory modules.

Tester 12 can cost from ten-thousand to millions of dollars. Cost can be reduced if a less-expensive tester replaces tester 12. Since most memory modules are intended for installation on PCs, some manufacturers test memory modules simply by plugging them into memory module sockets on PC motherboards. A test program is then executed on the PC, testing the inserted module. Since PCs cost only about a thousand dollars, tester 12 and handler 10 of FIG. 1 are replaced by a low-cost PC. Equipment costs are thus reduced by a factor of a hundred.

FIG. 2 shows a PC motherboard being used to manually test memory modules. Substrate 30 is a motherboard. Components 42, 44, mounted on the top side of substrate 30, include ICs such as a microprocessor, logic chips, buffers, and peripheral controllers. Sockets for expansion cards 46 are also mounted onto the top or component side of substrate 30.

Memory modules 36 are SIMM, DIMM, or other kinds of memory modules that fit into SIMM/DIMM sockets 38. SIMM/DIMM sockets 38 (hereinafter SIMM sockets 38) have metal pins that fit through holes in substrate 30. These pins are soldered to solder-side 34 of substrate 30 to rigidly attach SIMM sockets to the PC motherboard. Both electrical connection and mechanical support are provided by SIMM sockets 38.

While using PC motherboards for testing memory modules greatly reduces equipment costs, labor costs are increased. Memory modules must be inserted and removed manually. Manual insertion and removal of memory modules is slow and labor-intensive.

U.S. Pat. No. 6,178,526 teaches that the component side of the PC motherboard is too crowded for attaching a SIMM/DIMM handler. The inventors realized that the back or solder-side of the PC motherboard is less crowded and provides unobstructed access. The PC motherboard is modified to provide reverse attachment of the memory-module handler to the solder-side of the PC motherboard using a handler adapter board. The SIMM socket on the component side of the PC motherboard is removed, and the handler adapter board is plugged from the backside into the holes on the PC motherboard for the SIMM socket.

Thus memory modules can be automatically inserted and removed from the adapter board that is reverse-mounted. Many memory modules are being tested in this manner today using low-cost PC motherboard testers.

While using a PC motherboard to test memory modules is feasible, memory chips that have not yet been soldered onto a memory module cannot be tested using a PC motherboard, since there are no sockets for individual DRAM memory chips. The PC motherboard only has sockets for memory modules.

Newer memory modules are more complex than earlier memory modules. For example, a common memory module known as a fully-buffered dual-inline memory module (FB-DIMM) uses a serial interface that sends packets to and from the motherboard. An Advanced Memory Buffer (AMB) on the memory module deserializes the packets and generates local control signals to the DRAM chips. Thus the interface on the motherboard is a serial interface, rather than a DRAM-control-signal interface.

DRAM chips are typically tested individually using a chip handler and an expensive IC tester. The large number of DRAM chips tested in this manner helps to keep test costs low. However, still lower test costs are desirable. Testing individual DRAM chips on a low-cost PC motherboard tester could reduce costs compared with using an expensive automated-test-equipment (ATE) integrated circuit tester.

What is desired is a PC motherboard tester that can test individual DRAM chips before they are assembled onto a memory module substrate. A system to interface individual DRAM chips to a PC motherboard that uses memory modules is desirable. Testing individual memory chips on a standard PC motherboard that has a serial interface to support fully-buffered memory modules is also desirable.

BRIEF DESCRIPTION OF THE DRAWINGS

FIGS. 8A, 8B are waveforms that highlight margin testing of setup and hold times by varying a delay of the clock to the DRAM chip being tested.

DETAILED DESCRIPTION

The present invention relates to an improvement in memory testing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
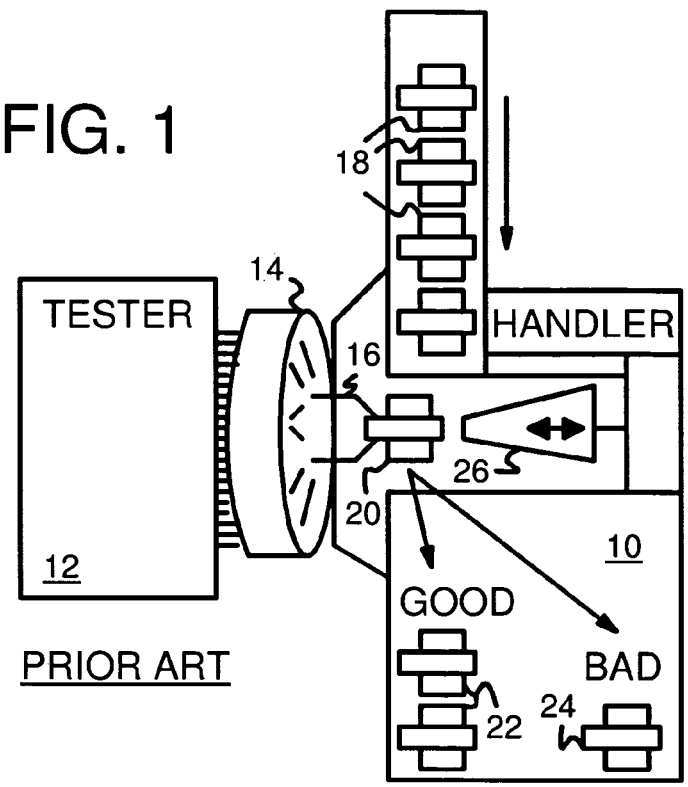
FIG. 1 shows a memory module handler connected to a high-speed electronic tester.
Figure 2:
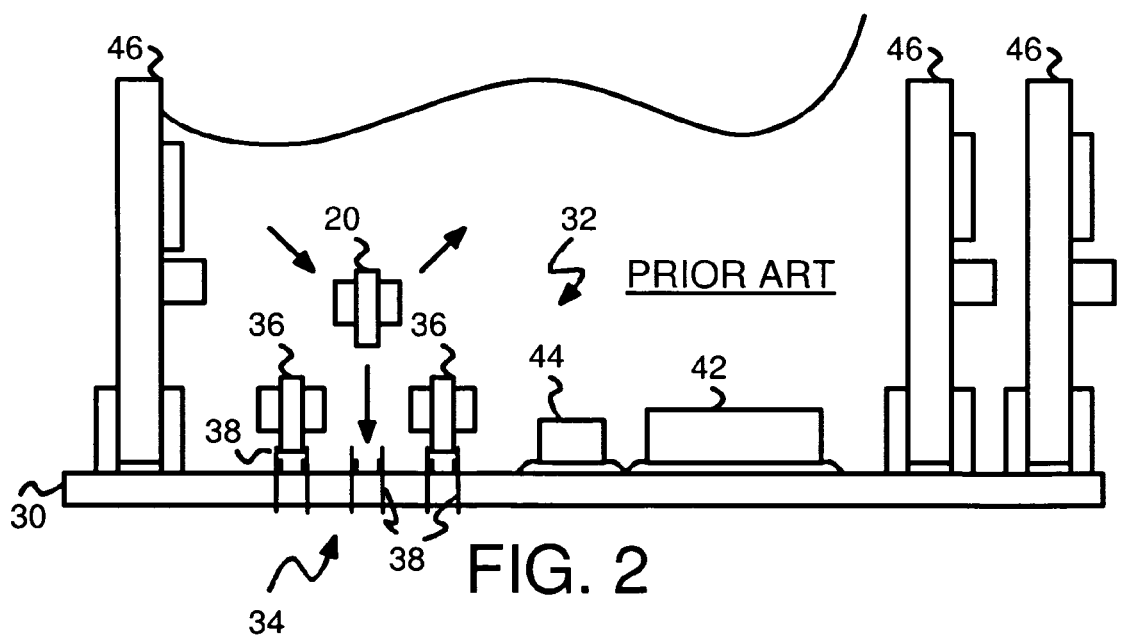
FIG. 2 shows a PC motherboard being used to manually test memory modules.
Figure 3:
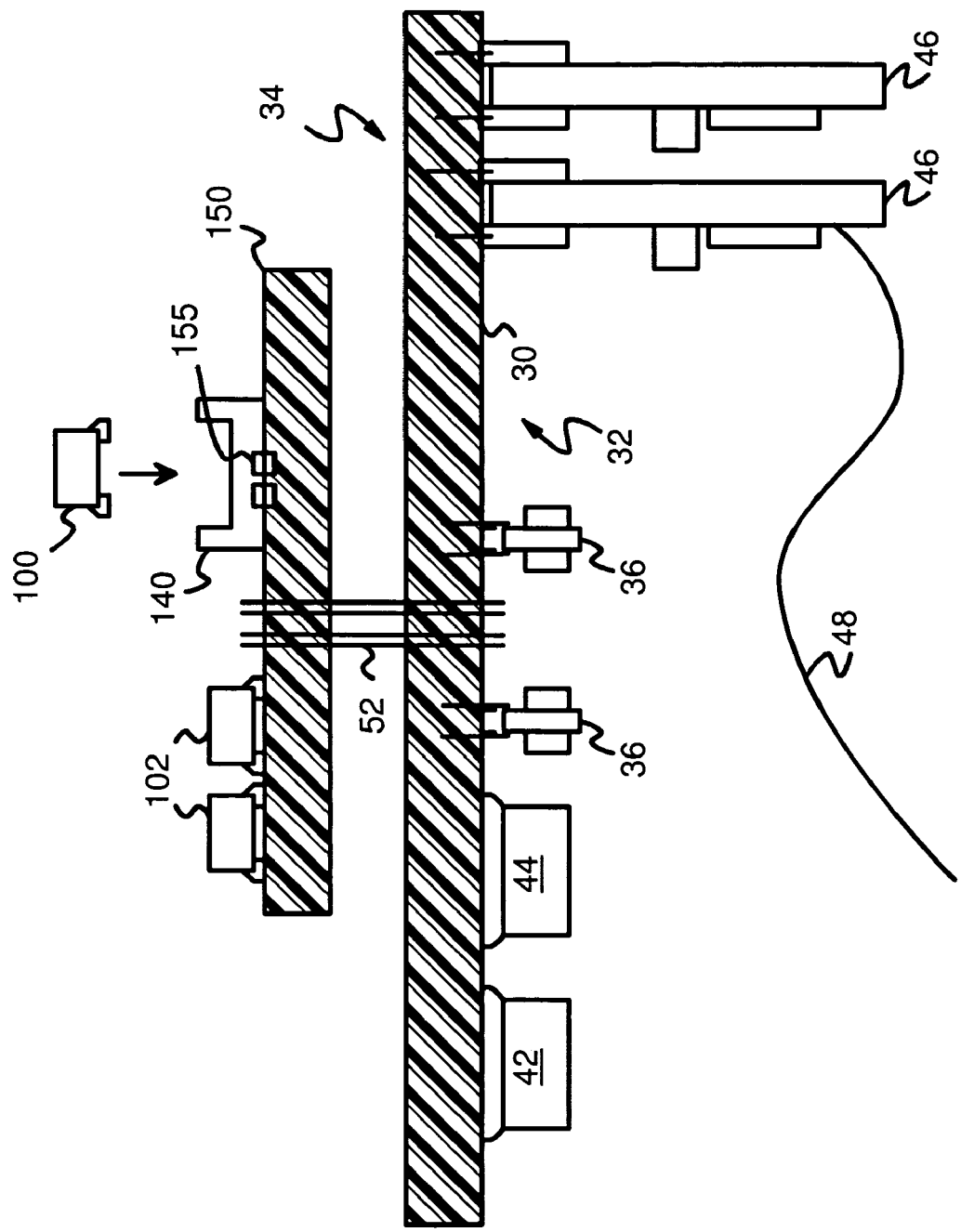
FIG. 3 is a cross-section of a DRAM-chip test adapter board reverse mounted to a PC motherboard.

FIG. 3 is a cross-section of a DRAM-chip test adapter board reverse mounted to a PC motherboard. Substrate 30 is a motherboard for a personal computer (PC) that is inverted in this Figure so that the topside of substrate 30 is facing downward. Components 42, 44, mounted on the top side of substrate 30, include ICs such as a microprocessor, logic chips, memory controllers, buffers, and peripheral controllers. Sockets for expansion cards (not shown) are also mounted onto the top or component side of substrate 30.

Memory modules 36 are memory modules that fit into memory-module sockets. Memory module sockets have metal pins that fit through holes in substrate 30. These pins are soldered to solder-side 34 (facing upward in FIG. 3) of substrate 30 to rigidly attach the memory module sockets to the PC motherboard. Both electrical connection and mechanical support are provided by memory module sockets.

Cables 48 and expansion cards 46 obstruct access to memory modules 36. A robotic arm would be unable to insert and remove memory modules (or chips) from the memory modules socket on the component side of substrate 30 due to the obstruction of cables 48 and expansion cards 46.

Test adapter board 150 is a small epoxy-glass circuit board designed to allow an automated handler, a person, or a robotic arm easy access to chip test socket 140 that is mounted on adapter board 150. Test socket 140 on one surface of test adapter board 150 mates with the pins or leads of DRAM chip 100, the device-under-test. Chip test socket 140 is soldered to wiring traces on test adapter board 150 at socket pads 155.

The other surface of adapter board 150 has adapter pins 52 protruding through. These adapter pins are soldered into through-holes in adapter board 150. Adapter pins 52 are arranged to have the same arrangement and spacing as the substrate-mounting pins for memory module sockets that hold memory modules 36 on PC motherboard substrate 30.

One or more of the memory module sockets has been removed from the component side of the PC motherboard, leaving the through-holes. Adapter pins 52 are then fitted through the exposed through holes for the removed memory module socket. Rather than push the pins through from component-side 32 of motherboard substrate 30, adapter pins 52 are pushed through from solder-side 34 to component-side 32. Adapter pins 52 are then soldered to substrate 30.

Test adapter board 150 provides electrical connection and interfaces between the memory module socket pins and the pins of DRAM chip 100 being tested. For unbuffered memory modules, address and data lines from the memory module socket pins can be routed to pins in chip test socket 140 that mate with pins of DRAM chip 100. However, when the PC motherboard supports buffered memory modules such as FB-DIMM, test adapter board 150 also contains buffer chips that interface to the motherboard and to DRAM chip 100. For example, an Advanced Memory Buffer (AMB) chip may be mounted on test adapter board 150 to convert serial packets from the motherboard substrate 30 to parallel data and other control signals such as RAS and CAS to access DRAM chip 100.

Test adapter board 150 provides a slight vertical spacing or offset from solder-side 34 surface of substrate 30, allowing a handler, person, or robotic arm to easily reach chip test socket 140 and plug DRAM chip 100 under test directly into chip test socket 140 on adapter board 150. Since the offset of adapter board 150 is slight, the length of electrical connections to the motherboard is short, minimizing added loading on the PC's memory bus. Also minimized is signal discontinuity due to the slightly different characteristic impedance compared with the metal traces on substrate. The relatively flat surface of solder-side 34 of substrate 30 allows close mounting of chip test socket 140 to the PC motherboard.

Since a memory module usually has several memory chips, additional memory chips 102 may be mounted to a surface of test adapter board 150. Additional memory chips 102 may be additional DRAM memory chips so that the full data width of memory may be provided by test adapter board 150 as would be provided by memory modules 36. Additional memory chips 102 could also include buffer chips such as registers for a registered memory module, or an Advanced Memory Buffer (AMB) when memory modules 36 are FB-DIMMs. Thus test adapter board 150 mimics the same kind of memory module as memory modules 36 inserted into sockets on PC motherboard substrate 30.

Figure 4:
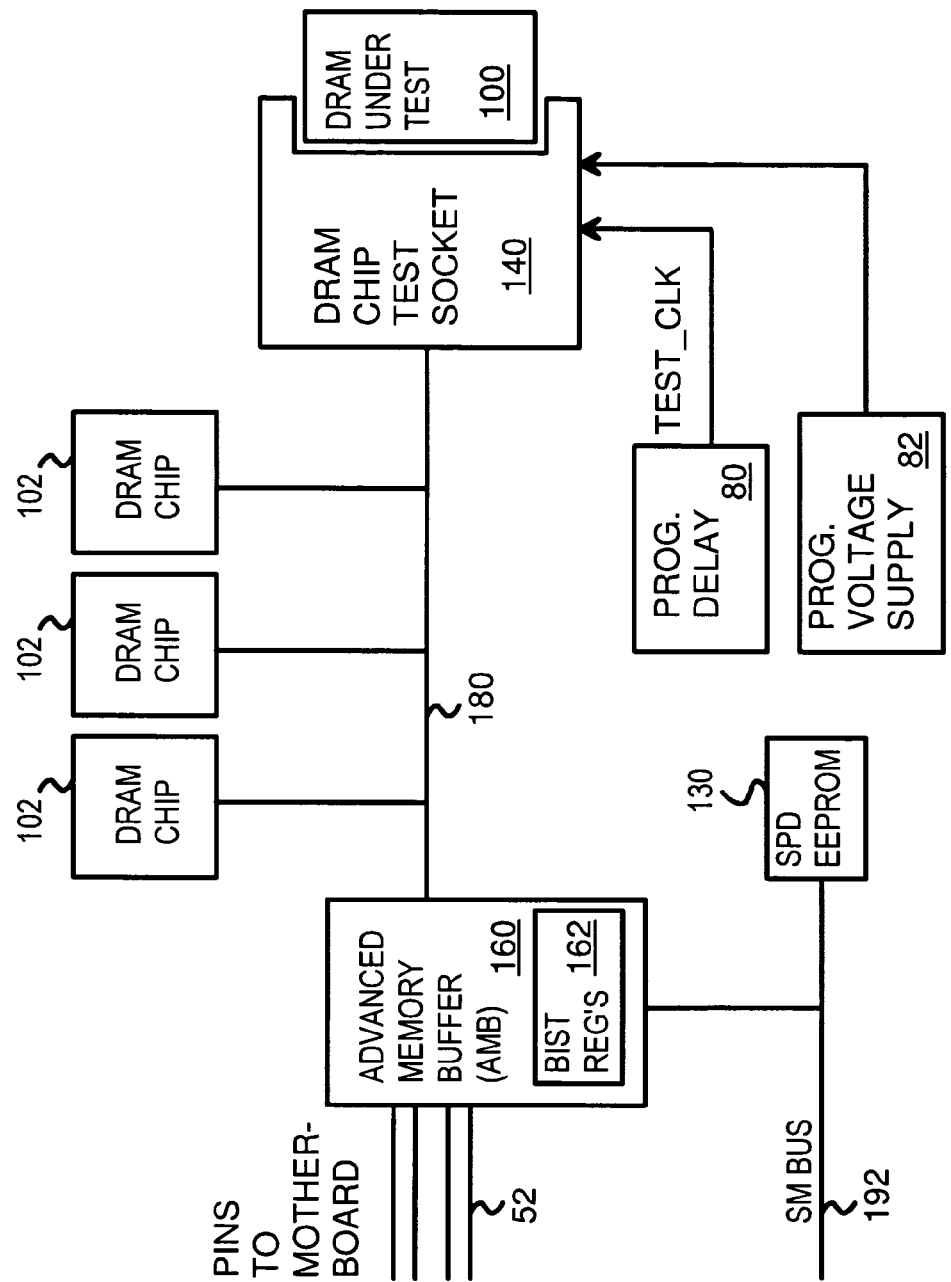
FIG. 4 is a block diagram of a fully-buffered test adapter board for testing DRAM chips through a memory module socket on a PC motherboard.

FIG. 4 is a block diagram of a fully-buffered test adapter board for testing DRAM chips through a memory module socket on a PC motherboard. Serial packets from the motherboard are carried over adapter pins 52 to test adapter board 150. AMB 160 contains a serial packet interface that reads commands, data, and addresses from these packets and generates memory control signals such as RAS and CAS to read and write data from memory chips 102. Address and data are buffered and driven in parallel to additional memory chips 102 over internal memory bus 180.

DRAM chip 100 under test is also connected to internal memory bus 180 through chip test socket 140. The specified data width of the memory module may require several additional memory chips 102 beyond DRAM chip 100 in chip test socket 140. For example, a data width of 128 bits would require 15 additional memory chips 102 when DRAM chip 100 and additional memory chips 102 have 8 data I/O bits.

DRAM chip 100 could be tested by the processor on the motherboard explicitly writing and reading all memory locations in DRAM chip 100. Another way to test DRAM chip 100 is to use built-in-self-test (BIST) circuitry in AMB 160. BIST registers 162 can be programmed to activate a BIST controller in AMB 160 that tests memory on internal memory bus 180. The result of the memory test can be written back to BIST registers 162 by the BIST controller to indicate a pass or a fail. The processor can thus test DRAM chip 100 by writing to BIST registers 162, activating the BIST controller, and reading the test result from BIST registers 162 after testing is complete.

Using BIST in AMB 160 is a very powerful way to test DRAM chip 100. Writing test programs is greatly simplified, since a few commands to write and read BIST registers 162 can replace thousands of test vectors. Test development costs can be greatly reduced.

BIST register 162 may be read and written over system management SM bus 192 rather than by packets over adapter pins 52. SM bus 192 is a serial bus used to read programming information from serial-presence detect electrically-erasable programmable read-only memory SPD-EEPROM 130. SPD-EEPROM 130 stores configuration information about the memory module emulated by test adapter board 150, such as memory capacity, speed, CAS latency, data I/O width, manufacturer. SPD-EEPROM 130 is programmed by the memory module manufacturer and read at boot up by the personal computer to configure the PC's memory.

Margin testing can be performed by adjusting the power-supply voltage applied to DRAM chip 100 in chip test socket 140. Programmable voltage supply 82 can be programmed to adjust the power supply voltage for the device under test, such as for a minimum or maximum specified Vcc. Margins can be further tested by intentionally adding delays to signals. Programmable delay 80 can delay the clock or other signals such as RAS or CAS to DRAM chip 100. Margin testing can ensure that DRAM chip 100 has passed tests with an additional safety margin. Margin-tested parts may be more valuable for certain critical applications such as memory in critical servers.

Figure 5:
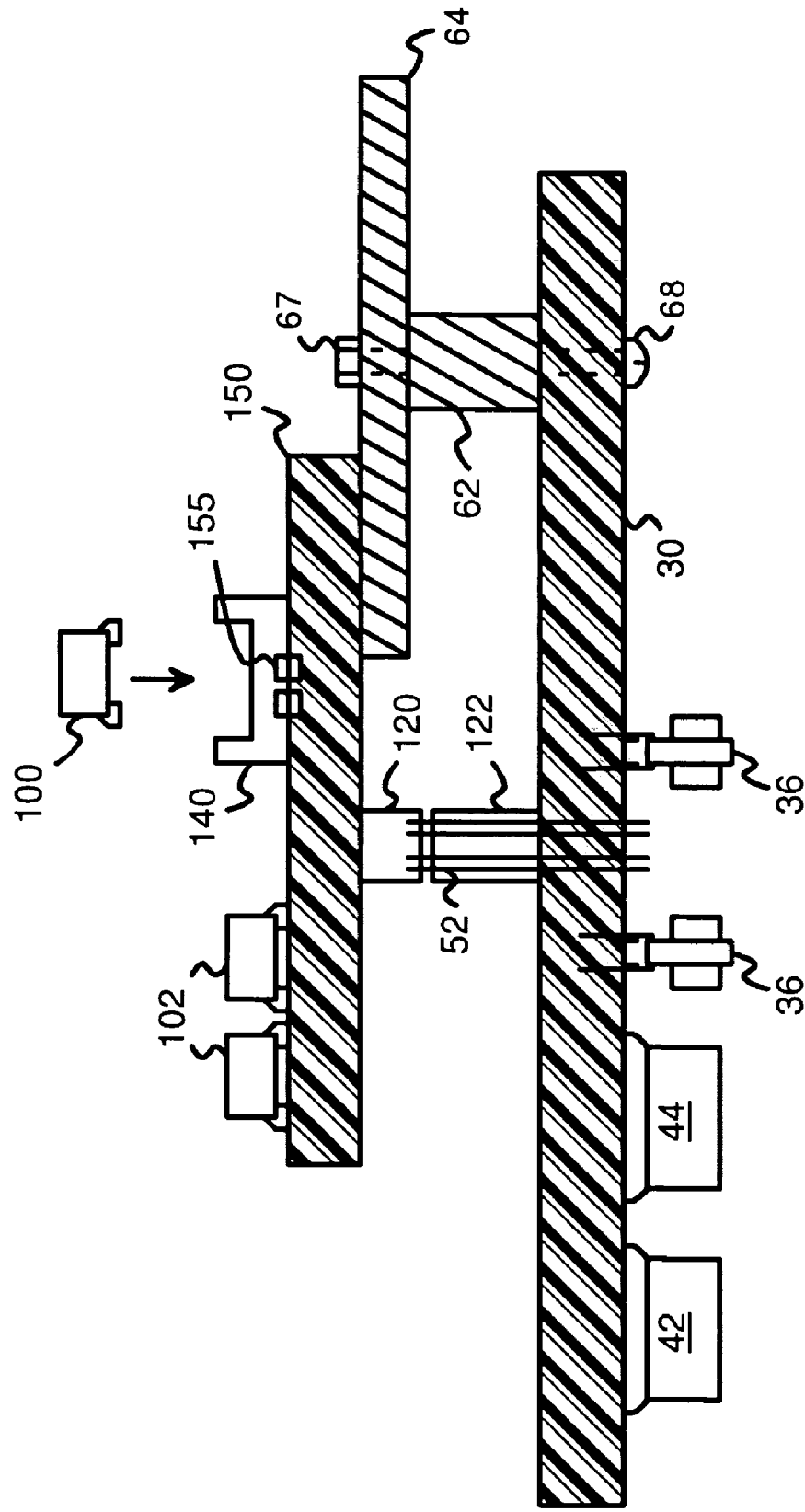
FIG. 5 is a cross-section of a DRAM-chip test adapter board reverse mounted to a PC motherboard using a connector plug and supported by a metal plate.

FIG. 5 is a cross-section of a DRAM-chip test adapter board reverse mounted to a PC motherboard using a connector plug and supported by a metal plate. Rather than have adapter pins 52 fit through test adapter board 150, connector 120 is soldered to the bottom surface of adapter board 150. Connector 120 mates with connector 122 that is mounted to solder-side 34 of motherboard substrate 30, at or near the location of the removed memory module socket. Adapter pins 52 may protrude through connector 122 and mate with holes in connector 120 as shown, or adapter pins 52 may be deleted and replaced by metal contact pads in connectors 120, 122. A wide variety of connector types may be used, such as high-speed connectors; RJ-45 connectors, parallel-port connectors, and USB connectors. Some trademarked connectors are Q-Strip, Q-Pairs, Q2-Shielded (from Samtec) which are designed for operation in the GHz range and are mountable to circuit boards.

Connectors 120, 122 can be high-speed connectors, and may include grounded shielding that surrounds the high-speed signals within the connector to minimize reflections and signal distortion. Connectors 120,122 facilitate quick removal of test adapter board 150 from motherboard substrate 30, allowing for replacement of a faulty chip test socket 140 by simply unplugging connector 120 from connector 122 and replacing with a new test adapter board 150. This is especially useful for parallel testers that have many PC motherboards with many test adapter boards 150, since downtime is minimized.

Metal plate 64 rigidly supports test adapter board 150. A metal chassis with an opening sized for test adapter board 150 could act as metal plate 64 and provide support on all four sides of test adapter board 150, rather than just the one side shown in this Figure. Metal plate 64 is held to motherboard substrate 30 by standoff 62. Motherboards are often mounted to a metal chassis such as a PC enclosure by such standoffs, which may act as thick washers. Standoff 62 is a metal cylinder that has bolt 68 passing through its center. Bolt 68 passes through a hole in motherboard substrate 30, through standoff 62, and metal plate 64, and is held in place by nut 67. The hole through metal plate 64 may also be threaded, eliminating the need for nut 67.

Components 42, 44, mounted on component-side 32 of substrate 30, include ICs such as a microprocessor, logic chips, memory controllers, buffers, and peripheral controllers. Memory modules 36 are memory modules that fit into memory-module sockets. Memory module sockets have metal pins that fit through holes in substrate 30. These pins are soldered to solder-side 34 of substrate 30.

Test adapter board 150 provides a slight vertical spacing or offset from solder-side 34 surface of substrate 30, allowing a handler, person, or robotic arm to easily reach chip test socket 140 and plug DRAM chip 100 under test directly into chip test socket 140 on adapter board 150. The relatively flat surface of solder-side 34 of substrate 30 allows close mounting of chip test socket 140 to the PC motherboard.

Test adapter board 150 provides electrical connection and packet interfaces such as serialization/deserialization between the memory module socket pins of the motherboard and the pins of DRAM chip 100 being tested. Additional memory chips 102 may be mounted to a surface of test adapter board 150. Additional memory chips 102 could include DRAM chips, buffer chips, or an AMB chip when memory modules 36 are FB-DIMMs. Thus test adapter board 150 mimics the same kind of memory module as memory modules 36 inserted into sockets on PC motherboard substrate 30.

Chip test socket 140 is a production-quality test socket requiring a low or zero insertion force and is able to accept many insertions, such as 100,000 or more insertions before the socket fails. Chip test socket 140 uses surface-mount technology in this embodiment, although traditional pins or other technologies such as ball-grid arrays could be substituted. Chip test socket 140 contains internal wiring to connect the power, ground, address, data, and control signals from DRAM chip 100 to socket pads 155 on the bottom of chip test socket 140. Socket pads 155 make electrical connections with matching pads on the top surface of the substrate of test adapter board 150. This substrate is typically epoxy-glass or fiberglass, usually with multiple metal layers for wiring, such as with a typical printed-circuit board (PCB).

Figure 6:
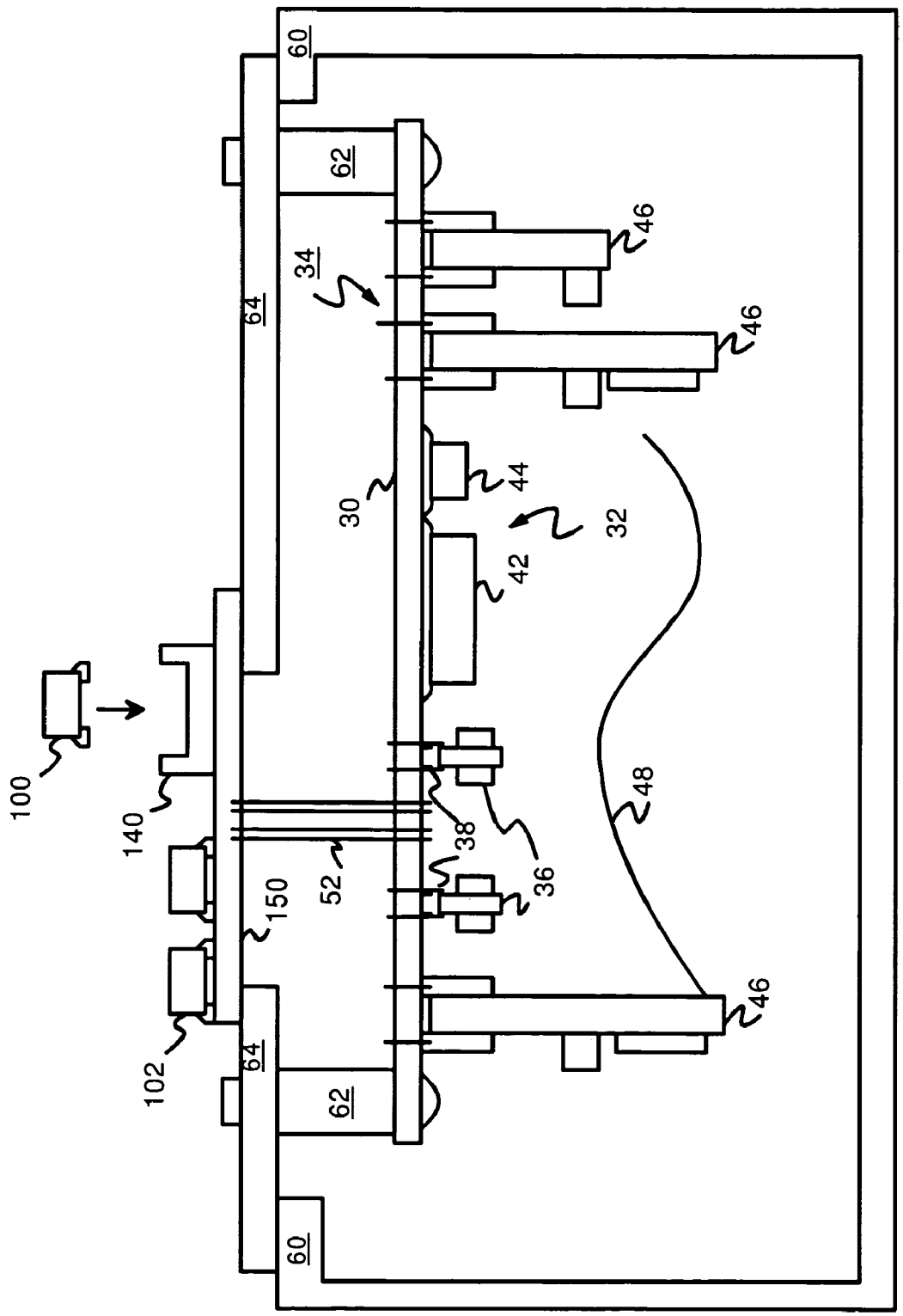
FIG. 6 illustrates the test adapter board and motherboard mounted in a chassis to a removable metal plate.

FIG. 6 illustrates the test adapter board and motherboard mounted in a chassis to a removable metal plate. A conventional PC motherboard is mounted upside-down within chassis 60. Rather than connect motherboard substrate 30 directly to chassis 60, motherboard substrate 30 is mounted to metal plate 64 by standoffs 62. Motherboard substrate 30 is not mounted directly to chassis 60 in this embodiment, although it could be in some embodiments.

Test adapter board 150 is mounted to metal plate 64. Chip test socket 140 is mounted to wiring traces on the top of test adapter board 150, while pins 52 provide electrical connection from wiring traces on test adapter board 150 to motherboard substrate 30. DRAM chip 100 being tested is inserted into chip test socket 140. Additional memory chips 102 on test adapter board 150 may also be tested during the test program, but are assumed to be good parts that don't cause the test program to fail.

Motherboard substrate 30 together with test adapter board 150 can be quickly removed from chassis 60 by lifting metal plate 64 up and out of chassis 60. Screws, bolts, or clamps (not shown) can be used to secure metal plate 64 to chassis 60. These screws can be quickly removed by a technician when the motherboard/test board assembly needs to be replaced. This allows the tester to continue operating with a replacement motherboard/test adapter board assembly with minimum downtime. Metal plate 64 normally has a larger area than does motherboard substrate 30 so that metal plate 64 has an overhang that can be used to mount it to chassis 60.

Motherboard substrate 30 has components 42, 44 mounted on component-side 32 of substrate 30. Memory modules 36 fit into memory module sockets 38. Memory modules sockets 38 have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm or handler inserting DRAM chip 100 into chip test socket 140 since cables 48 and expansion cards 46 are mounted below substrate 30, while chip test socket 140 is mounted above substrate 30. Cables 48 and expansion cards 46 are kept out of the way inside chassis 60.

Adapter pins 52 are soldered into through-holes in adapter board 150 and into holes in substrate 30. Adapter pins 52 are arranged to have the same arrangement and spacing as the substrate-mounting pins for memory module sockets 38. One or more of memory module sockets 38 has been removed from the component side of the PC motherboard, leaving the through-holes. Adapter pins 52 are then fitted through the exposed through holes for the removed memory module socket. Rather than push the pins through from component-side 32, adapter pins 52 are pushed through from solder-side 34 to component-side 32.

Figure 7:
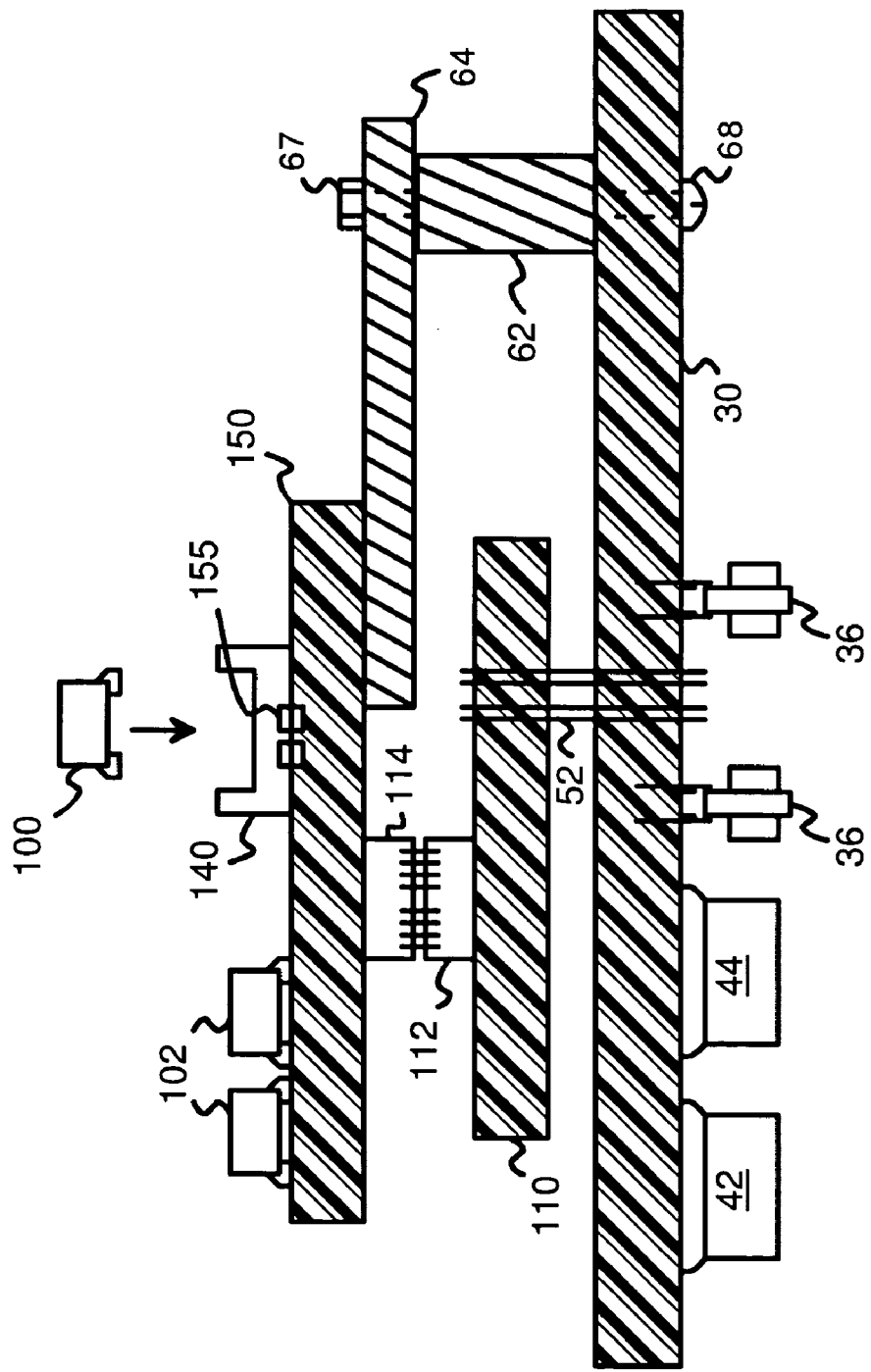
FIG. 7 is a cross-section of a DRAM-chip test adapter board reverse mounted to a PC motherboard using a connector plug and supported by a metal plate.

FIG. 7 is a cross-section of a DRAM-chip test adapter board reverse mounted to a PC motherboard using a connector plug and supported by a metal plate. It may be difficult to find connectors 120, 122 of FIG. 5 that match the layout or footprint of adapter pins 52 for the removed memory module socket on motherboard substrate 30. In this embodiment, intervening adapter board 110 is soldered to adapter pins 52 that protrude through solder side 34 of substrate 30 where the memory module socket was removed. Connector 112 is soldered to the top surface of intervening adapter board 110 and mates with connector 114, which is soldered to the bottom surface of test adapter board 150. Connectors 112, 114 can be high-speed connectors with shielding, and can be easily disconnected to allow test adapter board 150 to be replaced. Intervening adapter board 110 remains attached to PC motherboard substrate 30 by adapter pins 52.

Test adapter board 150 may be held to metal plate 64 by screws, clamps, or other devices (not shown) or may rest freely upon the top surface of metal plate 64 as shown. These screws, clamps, etc. may be removed when test adapter board 150 is replaced. Metal plate 64 may be part of a larger fixed chassis, while PC motherboard substrate 30 and test adapter board 150 are removably attached to the chassis that includes metal plate 64.

Metal plate 64 is held to motherboard substrate 30 by standoff 62. Bolt 68 passes through a hole in motherboard substrate 30, through standoff 62, and metal plate 64, and is held in place by nut 67.

Test adapter board 150 provides electrical connection and packet interfaces such as serialization/deserialization between the memory module socket pins of the motherboard and the pins of DRAM chip 100 being tested. Additional memory chips 102 may be mounted to a surface of test adapter board 150. Additional memory chips 102 could include DRAM chips, buffer chips, or an AMB chip when memory modules 36 are FB-DIMMs. Thus test adapter board 150 mimics the same kind of memory module as memory modules 36 inserted into sockets on PC motherboard substrate 30.

Margin Testing—FIGS. 8A, 8B

FIGS. 8A, 8B are waveforms that highlight margin testing of setup and hold times by varying a delay of the clock to the DRAM chip being tested. FIG. 8A shows a waveform of address, data, and control signals applied to the DRAM chip being tested. These signals change at about the same time, in response to clocks in the chip sets on the motherboard. The changing of these signals is represented by the cross-over points when the signal voltages cross the reference voltage Vref. Vref is the switching threshold, which can be approximated by Vcc/2.

FIG. 8B shows the clock applied to the DRAM chip being tested in the test adapter board. The phase delay of this clock is adjusted by the delay circuit on the test adapter board, or by the clock generator chip on the motherboard. Under normal conditions, the clock has the nominal delay and is shown by nominal clock 92. The address, data, and other control signals must meet specified setup and hold times to this nominal clock 92. These nominal setup and hold times are shown in FIG. 8A as TS and TH.

The delay circuit or clock generator chip can be re-programmed by the test program to reduce the clock delay so that early clock 90 is generated instead of nominal clock 92. Since the phase delay of early clock 92 is reduced, the setup time TS' is also reduced. Test patterns can be written to the DRAM chip being tested and read back to check for errors. When errors such as data mis-match occur for early clock 90 but not for nominal clock 92, then the DRAM chip can be rejected as a marginal part that fails the setup margin test.

Likewise, the delay circuit or clock generator chip can again be re-programmed by the test program to increase the clock delay so that late clock 94 is generated instead of nominal clock 92 or early clock 90. Since the phase delay of late clock 94 is increased, the hold time TH' is reduced. Test patterns are then written to the DRAM chip being tested and read back to check for errors. When errors such as data mismatch occur for late clock 94 but not for nominal clock 92, then the DRAM chip can be rejected as a marginal part that fails the hold margin test.

The amount of delay for early clock 90 and late clock 94 can be set to match the setup and hold times in the specification for the DRAM chip being tested, or can include an additional guard-band. The test using nominal clock 92 could be skipped to reduce tester time.

The Vcc voltage can also be adjusted before the setup and hold margin tests are performed. For example, the setup and hold margin tests can be executed when Vcc is set to Vcc−5%, and then repeated for Vcc+5%.

Figure 9:
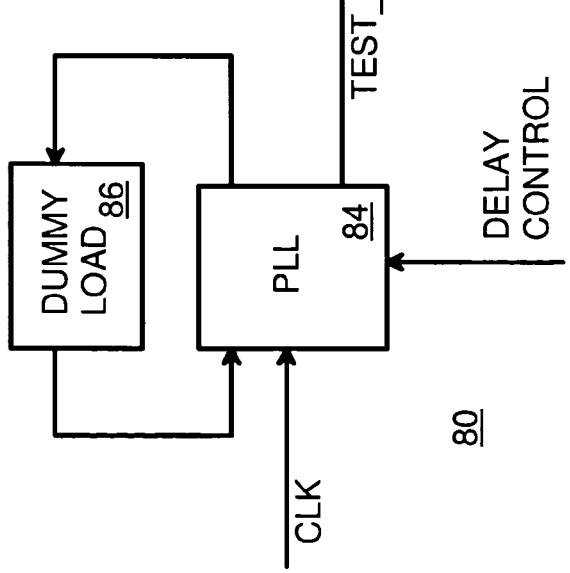
FIG. 9 shows a clock delay circuit that uses a PLL.
Figure 10:
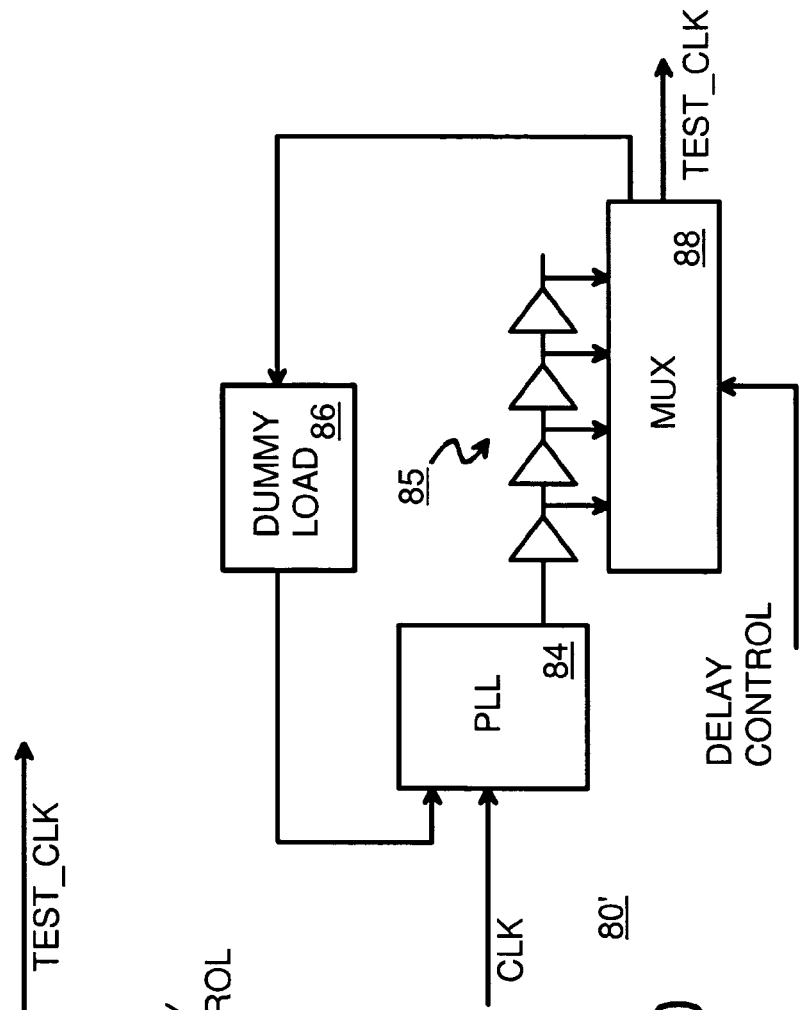
FIG. 10 shows in more detail a PLL-based delay circuit with a selectable phase delay.

Delay Circuit—FIGS. 9, 10

A simple programmable delay line could be used as programmable delay 80 of FIG. 4. The amount of delay is programmed into the delay chip. Such delay chips are commercially available and act as programmable delay lines. For example, a programmable delay line is available from Data Delay Devices, Inc. of Clifton, N. J., as the PDV-1316F part.

Another embodiment of programmable delay 80 is to use a phase-locked loop (PLL). This allows the frequency as well as the phase delay to be changed. A stable clock can be generated because of the feedback loop. FIG. 9 shows a clock delay circuit that uses a PLL. The DRAM clock from the PC motherboard is input to open-loop PLL 84 in programmable delay 80 on the test adapter board. The feedback loop of open-loop PLL 84, which is generated by the voltage-controlled oscillator (VCO) in PLL 84, is fed through dummy load 86. Dummy load 86 can be a series resistor with a capacitor to ground, although an inductance or other kind of load can be substituted. Dummy load 86 is designed to match the loading on the clock output, TEST_CLK. The DELAY CONTROL signal is used to adjust the phase delay or frequency of the clock output by PLL 84.

FIG. 10 shows in more detail a PLL-based delay circuit with a selectable phase delay. Programmable delay 80' has delay buffers 85 that receive the output from open-loop PLL 84. The feedback to dummy load 86 is taken from the center of delay buffers 85 by mux 88. Mux 88 also selects the output from one of delay buffers 85 in response to the delay control signal, and outputs the selected delayed clock as TEST_CLK, the clock to DRAM chip 100 in the test socket. Open-loop PLL 84 performs a phase comparison of its two inputs, and can include a charge pump, a loop filter, and VCO, or digital equivalents.

Various other embodiments of PLL-based delay circuits are possible. For example, a selectable-delay digital PLL can be used. See U.S. Pat. No. 5,502,750 by Co et al., and assigned to Pericom Semiconductor Corp. of San Jose, Calif.

Figure 11:
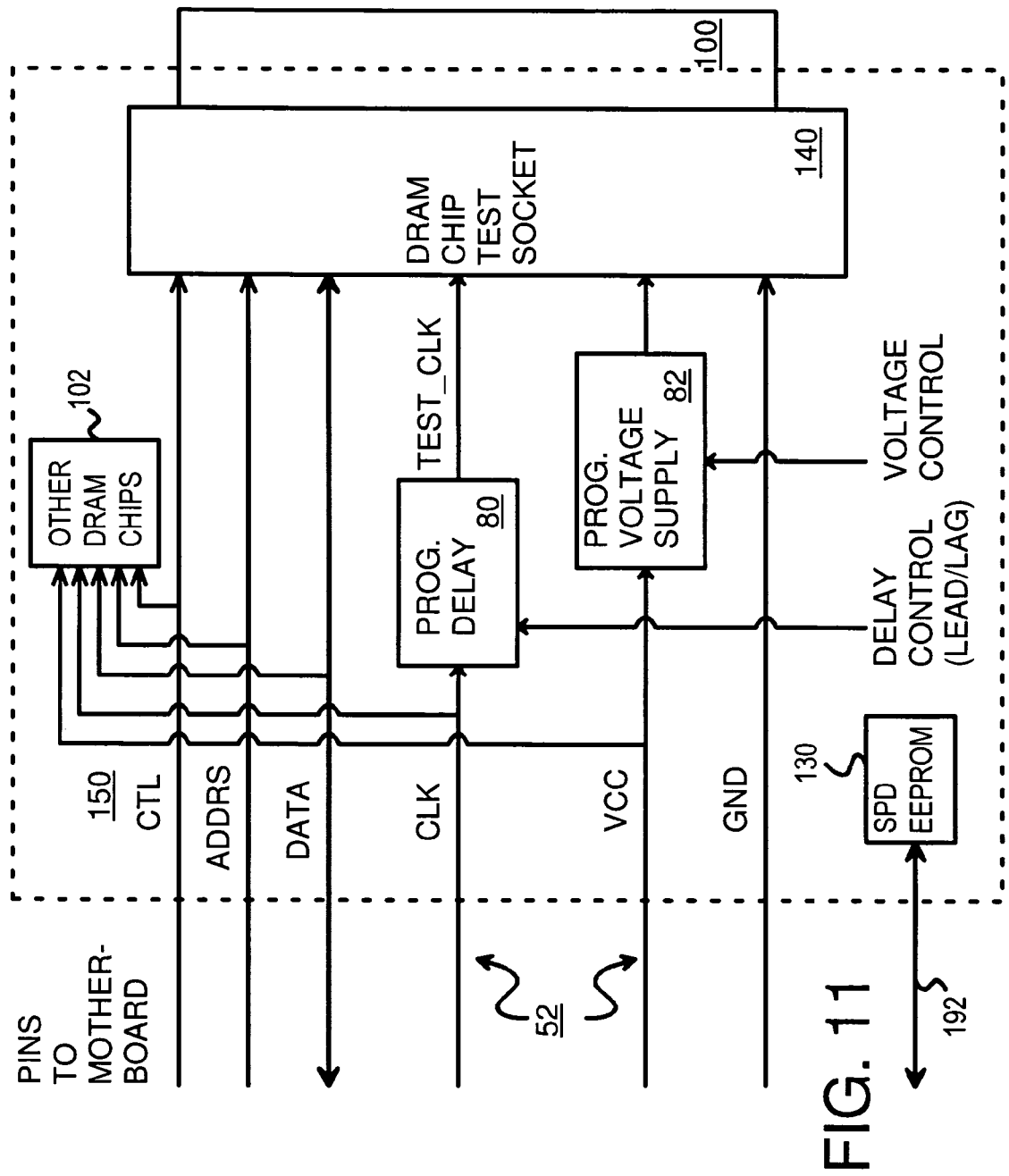
FIG. 11 is a schematic of an un-buffered test adapter board with added margin-test circuits.

Un-buffered Test Adapter Board with Margin Test Circuits—FIG. 11

FIG. 11 is a schematic of an un-buffered test adapter board with added margin-test circuits. In this embodiment, memory modules 36 on the motherboard are unbuffered memory modules that receive parallel address and data from the memory controller on the motherboard. Serial packets and an AMB are not supported by the motherboard. In this simpler embodiment, test adapter board 150 does not have an AMB.

Test adapter board 150 receives address, data, control, and power and ground signals over adapter pins 52 from the PC motherboard. Test adapter board 150 has chip test socket 140 mounted thereon. Chip test socket 140 is a high-quality low- or zero-insertion-force socket when DRAM chip 100 is inserted directly into chip test socket 140. Chip test socket 140 could be a connector to a handler when the DRAM chip remains in the handler.

Some signals from adapter pins 52 are connected directly to chip test socket 140 and to additional memory chips 102, such as the address and data signals, and ground. Most of the control signals, such as RAS and CAS or OE, are also directly connected. However, the clock signal CLK is altered by programmable delay 80. Many memory modules use synchronous DRAMs that include a clock input. The data signals must meet setup and hold times to this clock for the DRAM specification to be met. For non-synchronous DRAMs, programmable delay 80 can be applied to other control signals, such as RAS or CAS.

Programmable delay 80 adjusts the delay or phase of the clock (TEST_CLK) to chip test socket 140. In some embodiments, the frequency of the clock can also be varied by programmable delay 80. The amount of delay added or frequency adjustment is programmable. The delay control signal can be driven by a programmable register on test adapter board 150, or by a programmable register or microcontroller on a controller card that is inserted into one of the expansion slots on the PC motherboard, such as an AT-bus or PCI-bus slot. The delay control signal could also be driven by a register that is written using SM bus 192 that is normally used to read serial-presence-detect information in SPD-EEPROM 130.

The power-supply voltage Vcc to the DRAM chip 100 in chip test socket 140 is also varied using programmable voltage supply 82. Programmable voltage supply 82 can be a standard voltage regulator chip, such as those available commercially. Examples of voltage regulator chips from Linear Technology Corporation of Milpitas, Calif. include the LT1585CT and LT317CT devices. The voltage output is typically set by a resistor divider. By using a digital potentiometer (a resistor chain with programmable taps) as the resistor divider, the voltage output can be controlled through a programmable register. The Vcc voltage to DRAM chip 100 in chip test socket 140 is controlled by programmable voltage supply 82 in response to the voltage control input, which may also be generated by a programmable register, preferably on a controller card, or programmed through SM bus 192.

The power-supply voltage to DRAM chip 100 can be adjusted to target voltages, such as Vcc+5%, or Vcc−5%. When a voltage regulator is used, the absolute voltage desired can be programmed in, and the output Vcc is regulated to this voltage regardless of variations on the input Vcc from the motherboard. Additional memory chips 102 may receive the nominal Vcc while DRAM chip 100 receives the programmable Vcc.

A test program executing on the PC motherboard can re-program the programmable registers on the controller card by executing an AT-bus or I/O write cycle. The new value in the programmable registers adjusts the Vcc voltage from programmable voltage supply 82 or the clock delay produced by programmable delay 80. This allows the test program to first test the module under nominal delay and Vcc conditions, then drop Vcc to a minimum-Vcc value and repeat the test, perhaps adjusting delay in increments with a program loop.

Figure 12:
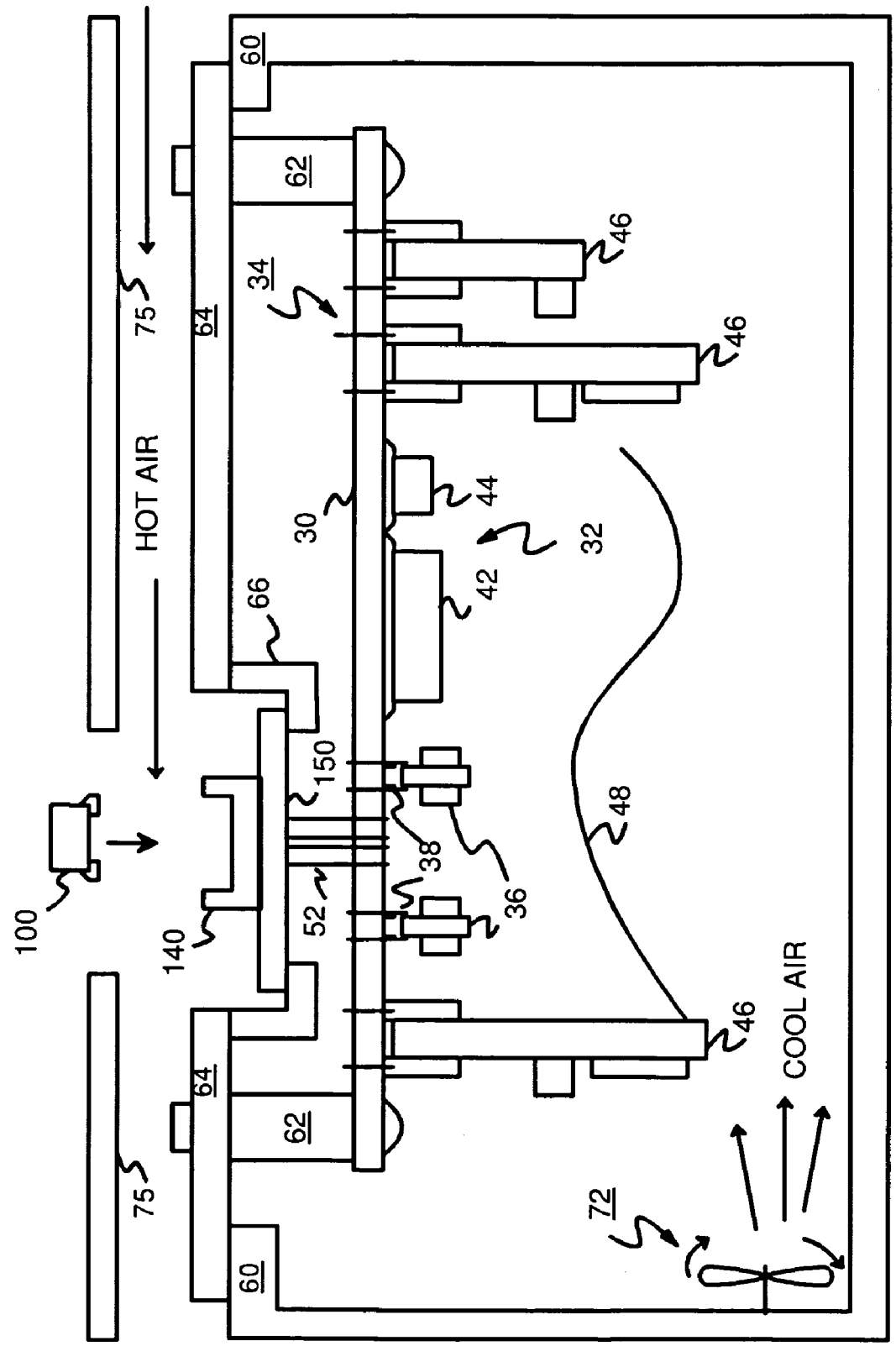
FIG. 12 highlights using a top plate to funnel hot air to the DRAM chip being tested, while the motherboard inside the chassis is cooled.
Figure 13:
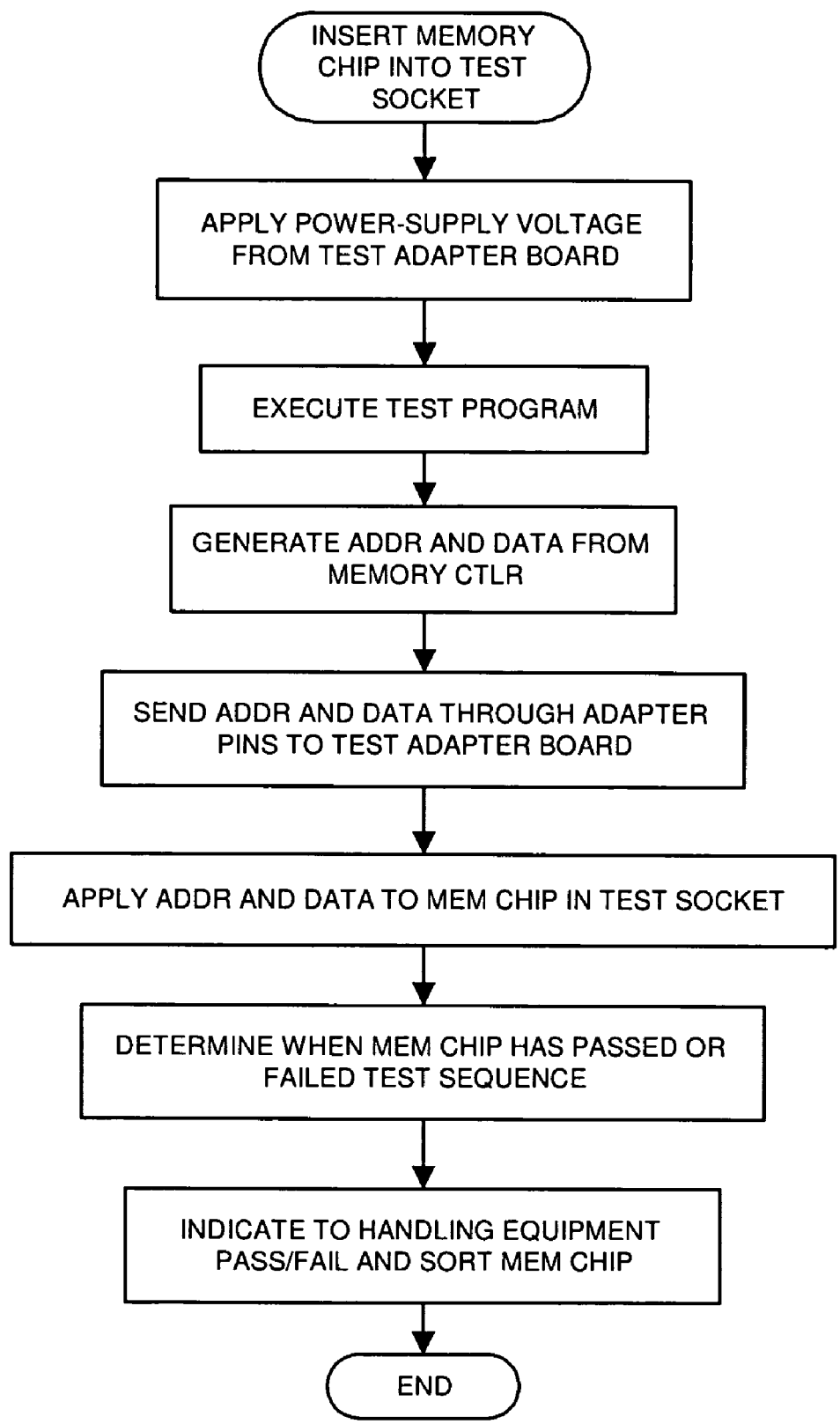
FIG. 13 is a flowchart of a testing method using a test adaptor board.

FIG. 12 highlights using a top plate to funnel hot air to the DRAM chip being tested, while the motherboard inside the chassis is cooled. The apparatus described for FIG. 6 is used, with the addition of top plate 75. Top plate 75 can be mounted to chassis 60 in a variety of ways, such as by standoffs or metal guides or brackets. Top plate 75 has an opening to allow access to chip test socket 140 so that a robotic arm can insert and remove DRAM chip 100 from chip test socket 140.

When environmental testing is desired, heated air is forced between top plate 75 and metal plate 64. This heated air blows past DRAM chip 100 when it is inserted into chip test socket 140. The heated air warms DRAM chip 100 to an elevated temperature. When DRAM chip 100 is heated, it is more likely to fail than when at room temperature. Such elevated-temperature testing provides a margin or guard-band to the test, so that the passing memory chips are more reliable than chips tested at room temperature.

Cooling fan 72 is provided in chassis 60 to cool motherboard substrate 30 and its components 42, 44 and expansion cards 46. Even air at room temperature can be effective at cooling the motherboard if a sufficient volume of air is blown past the motherboard's components. Components such as integrated circuits heat up during operation and benefit from such cooling. Of course, reduced-temperature air could also be blown into chassis 60, such as air from outside a building in a cold climate.

Since metal plate 64 separates motherboard substrate 30 from test adapter board 150, the cooling air from cooling fan 72 is separated from the heated air blown against DRAM chip 100 under test. Test adapter board 150 is mounted within well 66 and forms a sufficient seal to prevent the cooling air within chassis 60 from cooling DRAM chip 100 being heated and tested. The cooling air within chassis 60 is thus prevented by metal plate 64, well 66, and test adapter board 150 from mixing with the heated air blown between metal plate 64 and top plate 75. Rather than use well 66, test adapter board 150 could be flush mounted to metal plate 64.

Metal plate 64 may conduct some heat, but such heat conduction can be reduced by providing an insulating film on metal plate 64, or by using a less-conductive material such as a composite or plastic for plate 64. Top plate 75 can be replaced with a tube, rectangular pipe, or air guide that blows hot air directly on DRAM chip 100. This may provide a more efficient air flow. Temperature sensors such as thermocouples could be added near the test socket.

Chassis 60 can be provided with slots, holes and openings to allow for air flow to motherboard components 42, 44 and expansion cards 46. Multiple cooling fans can be used. A larger chassis with multiple openings on the top, each for holding a metal plate 64 with a motherboard and test adapter board can be used. This allows for parallel testing using several motherboards and test sockets.

Of course, cold air rather than hot air could be blown onto the memory chips by the channel between the top plate and the metal plate. This might be useful for characterizing DRAM chips rather than for guard-band testing. Humid hot air could be used for testing hermetic seals of memory chips, and even hot and cold air cycling could be done for reliability testing. The air may be recycled and re-blown through the channel by a blower or other air-flow system.

Alternate Embodiments

Several other embodiments are contemplated by the inventors. For example, many kinds of DRAM chips and memory modules can be tested. Test adapter board 150 can emulate modules using standard DRAM or newer EDO and synchronous DRAM. The system is ideally suited for testing the highest-speed memory chips, since capacitive loading is minimized. Other memories such as RAMBUS modules, DDR modules, and PC133 synchronous modules can be tested.

Various sizes of memory in the chip test socket, and form factors for memory chips and modules can be used with the invention. Different kinds and shapes of test adapter boards can be substituted. The reverse-mounting of the test adapter boards and the solder-side up arrangement of the test station allows a technician or operator to easily replace the test adapter boards when necessary. Non-PC motherboards can also be used. The invention can be applied to any target system board. Multiple chip test sockets can be mounted on each test adapter board, or multiple test adapter boards may be mounted on a single motherboard, allowing multiple DRAM chips to be tested at the same time by the same motherboard acting as a tester.

Many combinations of margins could be tested for, such as Vcc, clock delay, and temperature. Electrically insulating material may be inserted between the test adapter board and the motherboard, permitting a closer spacing.

A heating element could be added to the test adapter board. The heating element could heat the memory chip in the test socket to a desired temperature for temperature margin tests. The amount of heating could be controlled by a heating voltage supplied by the controller card. A thermocouple could be included on the test adapter board to measure the temperature near the test socket. This is useful regardless of the heating or cooling method used, such as when hot or cold air is blown onto the test socket.

Adapter pins 52 connecting the test adapter board to the motherboard could take on a variety of shapes and forms, and could even have a ball shape for very close spacings to the motherboard. The pins could be replaced by surface-mounting of the test adapter board to the motherboard. A cable or wires could also be used in place of the pins. Pins from the test adapter board that plug into the motherboard can have a ring (outward-going notch and joined to the pin), which prevents it from going beyond the top surface of the test adapter board.

The adapter pins could be soldered to or pressure-gripped to the test adapter board and may be soldered to holes in the motherboard or inserted into pin receptacles that have been inserted into the holes.

In another alternate embodiment, small cups or pin receptacles are inserted into the holes on the motherboard where the DRAM socket was removed. The pins from the test adapter board plug into these receptacles. In that embodiment, the pins are not soldered directly onto the motherboard. This allows for easy replacement of the motherboard or test adapter board.

The test assembly can be flipped, rotated, turned or otherwise changed in orientation so that the test socket faces to the side or downwardly. The invention can operate in a variety of such orientations, and the description has used an upward orientation for convenience and clarity. When the orientation is altered interpretations of spatial descriptions such as "above" and "below" can be adjusted accordingly. Multiple test assemblies of motherboards and test adapter boards can be mounted on a bigger chassis with multiple cavities.

The test adapter board could also be mounted vertically to the motherboard or to the intervening adapter board. The intervening adapter board could have an edge-connector socket that receives an edge connector on the test adapter board. Thus the motherboard and the test adapter board could be perpendicular to each other rather than parallel to each other.

Additional delay circuits can be added to the test adapter board, allowing two or more signals to the memory chip under test to be skewed relative to each other. A sequencer could be added to the test adapter board to automatically sequence Vcc and the clock skew once a test is started or power is applied when a new DRAM chip is inserted. Values can be specified in a variety of ways, both directly and indirectly. Margins rather than actual voltage or delay values can be specified, or even encoded.

While DRAM chips have been described, testing of other chips could be supported, such as SRAM, EEPROM, or even non-memory chips such as AMB's.

The term "pins" has been used to describe connectors for chips and board, but the actual pins may be leads, pads, solder balls, bent metal pads, or a variety of other connectors rather than just pointy metal pins. These are all considered to be pins.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A personal-computer-motherboard memory-chip tester comprising:
    a motherboard, the motherboard being a main board for a computer using memory modules as a memory, the motherboard having a component side and a solder side, the component side having integrated circuits mounted thereon and expansion sockets for expansion boards;
    a supporting plate, mounted to the motherboard for supporting the motherboard;
    a chip test socket for receiving a memory chip for testing by the motherboard, the memory chip being removable from the chip test socket;
    a test adapter board having the chip test socket mounted thereon, the test adapter board for transferring data from the motherboard to the memory chip inserted into the chip test socket, the motherboard using the memory chip inserted into the chip test socket as a portion of the memory of the motherboard;
    additional memory chips mounted on the test adapter board, wherein the additional memory chips and the memory chip inserted into the chip test socket together form an emulated memory-module memory; and
    adapter pins connected between the test adapter board and the motherboard, for electrically connecting the test adapter board to the motherboard,
    whereby the memory chip inserted into the chip test socket on the test adapter board is tested by the motherboard accessing the emulated memory-module memory.

2. The personal-computer-motherboard memory-chip tester of claim 1 wherein the additional memory chips are soldered to the test adapter board and the memory chip is removably inserted into the chip test socket.

3. The personal-computer-motherboard memory-chip tester of claim 2 wherein the adapter pins are soldered to or pressure-gripped to the test adapter board and are soldered to holes in the motherboard or are inserted into pin receptacles that have been inserted into the holes, the holes for connecting to a missing memory-module socket on the motherboard;
    wherein the test adapter board is above a location of the missing memory-module socket on the motherboard, the missing memory-module socket being a type for holding a memory module;
    wherein the motherboard comprises other sockets for holding memory modules,
    whereby the test adapter board is mounted above the holes for the missing memory-module socket on the motherboard.

4. The personal-computer-motherboard memory-chip tester of claim 3 further comprising:
    a lower connector, mounted to the motherboard and carrying the adapter pins;
    an upper connector, mounted to the test adapter board, for mating with the lower connector;
    whereby the test adapter board is removable from the motherboard by disconnecting the lower connector from the upper connector.

5. The personal-computer-motherboard memory-chip tester of claim 2 further comprising:
    an Advanced Memory Buffer (AMB) mounted to the test adapter board, the AMB for receiving serial packets sent by the motherboard over the adapter pins, and for generating parallel address and data signals to the additional memory chips and to the memory chip for testing in the chip test socket,
    whereby serial packets from the motherboard are de-serialized by the AMB on the test adapter board.

6. The personal-computer-motherboard memory-chip tester of claim 5 wherein the AMB further comprises a built-in-self-test (BIST) controller that is activated by the motherboard to test the emulated memory-module memory that includes the memory chip inserted into the chip test socket.

7. The personal-computer-motherboard memory-chip tester of claim 6 further comprising:
    a serial-presence-detect electrically-erasable programmable read-only memory (SPD-EEPROM) mounted to the test adapter board, the SPD-EEPROM storing a configuration for the emulated memory-module memory emulated by the test adapter board, the configuration including a memory size and a speed parameter,
    whereby the test adapter board contains a SPD-EEPROM.

8. The personal-computer-motherboard memory-chip tester of claim 7 further comprising:
    BIST registers for controlling the BIST controller in the AMB;
    wherein the adapter pins carry a management bus that connects to the SPD-EEPROM and to the BIST registers in the AMB.

9. The personal-computer-motherboard memory-chip tester of claim 2 further comprising:
    an intervening adapter board fixedly attached to the motherboard by the adapter pins;
    a first connector mounted to the intervening adapter board and electrically connected to the adapter pins by wiring traces on the intervening adapter board;
    a second connector mounted to the test adapter board, for mating with the first connector,
    whereby the test adapter board is removable from the motherboard by disconnecting the second connector from the first connector on the intervening adapter board that is fixedly attached to the motherboard.

10. The personal-computer-motherboard memory-chip tester of claim 2 further comprising:
    a programmable delay generator, mounted to the test adapter board, for delaying a signal to the memory chip in the chip test socket in response to a test program executing on the motherboard,
    whereby margin timing testing is supported by the test adapter board.

11. The personal-computer-motherboard memory-chip tester of claim 2 further comprising:
    a programmable voltage supply, mounted to the test adapter board, for adjusting a power-supply voltage to the memory chip in the chip test socket in response to a test program executing on the motherboard,
    whereby margin voltage testing is supported by the test adapter board.

12. The personal-computer-motherboard memory-chip tester of claim 2 further comprising:

a chassis, having a top opening above the motherboard, the supporting plate being mounted to the chassis at the top opening;

wherein the motherboard is located within the chassis below the supporting plate, the motherboard not being directly mounted to the chassis;

wherein cooling air is blown onto the motherboard enclosed by the chassis, wherein the cooling air is blocked from blowing onto the memory chip inserted into the chip test socket for testing, whereby the cooling air cools the motherboard but does not directly cool the memory chip being tested in the chip test socket.

13. The personal-computer-motherboard memory-chip tester of claim 12 further comprising:

an air guide, situated above the supporting plate, for directing hot air onto the memory chip being tested in the chip test socket, whereby the memory chip being tested is heated by the hot air while the motherboard is cooled by the cooling air in the chassis.

14. A method for testing memory chips using a low-cost personal computer-motherboard tester comprising:

inserting a memory chip into a chip test socket for testing;

applying a power-supply voltage to the memory chip in the chip test socket from a test adapter board that the chip test socket is mounted to;

executing a test program on a processor on a personal computer motherboard;

generating address and data from a memory controller on a personal computer motherboard in response to test-program instructions executed by the processor on the personal computer motherboard;

sending the address and data generated by the memory controller through adapter pins to the test adapter board;

applying the address and data received by the adapter pins to the chip test socket to test the memory chip;

determining when the memory chip in the chip test socket has passed or failed a test sequence; and indicating to handling equipment when the memory in the chip test socket has passed or failed a test sequence and sorting the memory chip in response to passing or failing status, whereby the memory chip is tested by the test program executing on the personal computer motherboard using the test adapter board.

15. The method of claim 14 further comprising:

also applying the address and data received by the adapter pins to additional memory chips that are soldered to the test adapter board, the additional memory chips emulating memory on a memory module, whereby a full-width memory module is emulated by the additional memory chips and the memory chip tested in the chip test socket.

16. The method of claim 15 further comprising:

encapsulating in serial packets the address and data from the memory controller on the personal computer motherboard;

transmitting the serial packets over the adapter pins from the personal computer motherboard to the test adapter board;

extracting address and data from the serial packets using an Advanced Memory Buffer (AMB) mounted to the test adapter board;

using the AMB to generate a parallel address and a parallel data; and sending the parallel address and the parallel data from the AMB to the memory chip in the chip test socket, whereby serial packets received by the AMB on the test adapter board are used to generate parallel address and data to the chip test socket.

17. The method of claim 16 further comprising:

activating a built-in-self-test (BIST) controller on the test adapter board in response to test-program instructions executed by the processor on the personal computer motherboard;

locally generating a sequence of addresses and data using the BIST controller on the test adapter board;

applying the address and data locally generated by the BIST controller to the chip test socket to test the memory chip;

reading a test status register in the BIST controller to determine when the memory chip in the chip test socket has passed or failed a BIST test sequence, whereby the BIST controller on the test adapter board is activated by the test-program instructions executed by the processor on the personal computer motherboard.

18. The method of claim 15 further comprising:

reading a configuration stored in a serial-presence-detect electrically-erasable programmable read-only memory (SPD-EEPROM) mounted to the test adapter board in response to the test-program instructions executed by the processor on the personal computer motherboard, wherein the configuration is a configuration of the additional memory chips and the memory chip in the chip test socket.

19. A memory-chip test system comprising:

processor means for executing instructions in a test program;

motherboard means for connecting memory modules, a memory controller, expansion cards, and the processor means;

connector grid means, on the motherboard means, for connecting to mounting pins or pads of a missing memory-module socket;

adapter connection means, soldered to the connector grid means, for carrying memory-bus signals from the memory controller to a memory module;

chip test socket means for removably connecting to leads on a memory chip under test;

test adapter board means, having the chip test socket means mounted thereto, for driving address and data to the chip test socket means in response to the memory-bus signals received from the adapter connection means;

additional memory chip means, fixedly mounted to the test adapter board means, for storing data in a data word that spans the additional memory chip means and the memory chip under test inserted into the chip test socket means to emulate a full-width memory module; and chassis means for supporting the motherboard means and the test adapter board means, whereby the memory chip under test is tested by the test program executing on the processor means on the motherboard means using the test adapter board means.

20. The memory-chip test system of claim 19 further comprising:

advanced memory buffer means, mounted to the test adapter board means, for receiving serial packets from the adapter connection means that are generated by the motherboard means, the advanced memory buffer means also for generating parallel address and data to the chip test socket means by extracting address and data from the serial packets.

* * * * *